(12) United States Patent
Kume

(10) Patent No.: US 11,043,419 B2
(45) Date of Patent: *Jun. 22, 2021

(54) SEMICONDUCTOR DEVICE AND MANUFACTURING METHOD THEREOF

(71) Applicant: TOSHIBA MEMORY CORPORATION, Minato-ku (JP)

(72) Inventor: Ippei Kume, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/294,044

(22) Filed: Mar. 6, 2019

(65) Prior Publication Data
US 2020/0075498 A1 Mar. 5, 2020

(30) Foreign Application Priority Data
Sep. 5, 2018 (JP) .............................. JP2018-166102

(51) Int. Cl.
| | | |
|---|---|---|
| *H01L 21/768* | (2006.01) |
| *H01L 23/532* | (2006.01) |
| *H01L 23/48* | (2006.01) |
| *H01L 21/48* | (2006.01) |
| *H01L 21/311* | (2006.01) |
| *H01L 23/538* | (2006.01) |

(52) U.S. Cl.
CPC .. *H01L 21/76898* (2013.01); *H01L 21/31144* (2013.01); *H01L 21/486* (2013.01); *H01L 21/76802* (2013.01); *H01L 21/76831* (2013.01); *H01L 21/76832* (2013.01); *H01L 23/481* (2013.01); *H01L 23/5384* (2013.01); *H01L 23/53295* (2013.01)

(58) Field of Classification Search
CPC ..... H01L 21/76877–768779; H01L 21/76898; H01L 23/481; H01L 23/5384; H01L 23/49827; H01L 23/53295; H01L 23/5329; H01L 24/10; H01L 24/12–13; H01L 24/15–16; H01L 21/76802; H01L 21/31144; H01L 21/76831; H01L 21/76832; H01L 21/486
See application file for complete search history.

(56) References Cited

U.S. PATENT DOCUMENTS

| | | |
|---|---|---|
| 7,563,714 B2 | 7/2009 | Erturk et al. |
| 7,892,972 B2 | 2/2011 | Akram et al. |
| 8,492,902 B2 | 7/2013 | Lee et al. |

(Continued)

FOREIGN PATENT DOCUMENTS

| | | |
|---|---|---|
| JP | 2012-238862 | 12/2012 |
| JP | 2013-048274 | 3/2013 |

(Continued)

*Primary Examiner* — Jose R Diaz
(74) *Attorney, Agent, or Firm* — Oblon, McClelland, Maier & Neustadt, L.L.P.

(57) ABSTRACT

A semiconductor device according to an embodiment comprises a semiconductor substrate having a through hole from a first face to a second face on an opposite side to the first face. A metal part is provided inside the through hole. A stacked film is provided between the metal part and an inner side surface of the through hole, and comprises a plurality of different material films of two or more types having a relative permittivity equal to or lower than 6.5.

15 Claims, 10 Drawing Sheets

(56) References Cited

U.S. PATENT DOCUMENTS

| | | | |
|---|---|---|---|
| 8,754,531 B2* | 6/2014 | Chiu | ................ H01L 21/76877 |
| | | | 257/774 |
| 10,153,227 B2* | 12/2018 | Kume | ............... H01L 21/76828 |
| 10,204,862 B2 | 2/2019 | Kume et al. | |
| 2014/0264911 A1 | 9/2014 | Lin et al. | |
| 2016/0351473 A1* | 12/2016 | Uchida | ................... H01L 24/16 |
| 2016/0351503 A1 | 12/2016 | Kume et al. | |
| 2016/0351521 A1 | 12/2016 | Kume et al. | |
| 2019/0363037 A1* | 11/2019 | Kume | ............... H01L 21/76843 |

FOREIGN PATENT DOCUMENTS

| | | |
|---|---|---|
| JP | 2013-157540 | 8/2013 |
| JP | 2016-225471 | 12/2016 |
| JP | 2016-225474 | 12/2016 |
| TW | I579968 B | 4/2017 |

* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2018-166102, filed on Sep. 5, 2018, the entire contents of which are incorporated herein by reference.

FIELD

The embodiments of the present invention relate to a semiconductor device and manufacturing method thereof.

BACKGROUND

A method of electrically connecting a plurality of stacked semiconductor devices using TSVs (Through-Silicon Vias) has been developed. A TSV is provided for electrical connection of semiconductor devices and therefore is formed of a sufficiently-low resistance metal material.

However, when downscaling of semiconductor devices progresses, a TSV having a high aspect ratio is demanded. In a TSV having a high aspect ratio, etching to the bottom part thereof as designed is difficult and it is sometimes difficult to achieve low and stable contact resistance at the bottom part.

On the other hand, the aspect ratio may be reduced by enlarging the diameter of a TSV or thinning the thickness of a substrate. However, if the aspect ratio is small, there is not much difference between the thicknesses of insulating films formed on the outer side and the inner side of a TSV. Therefore, it is difficult to process the bottom part of a TSV in a self-aligned manner using the insulating film deposited on the outer side of the TSV as a mask.

DETAILED DESCRIPTION

Figure 1:
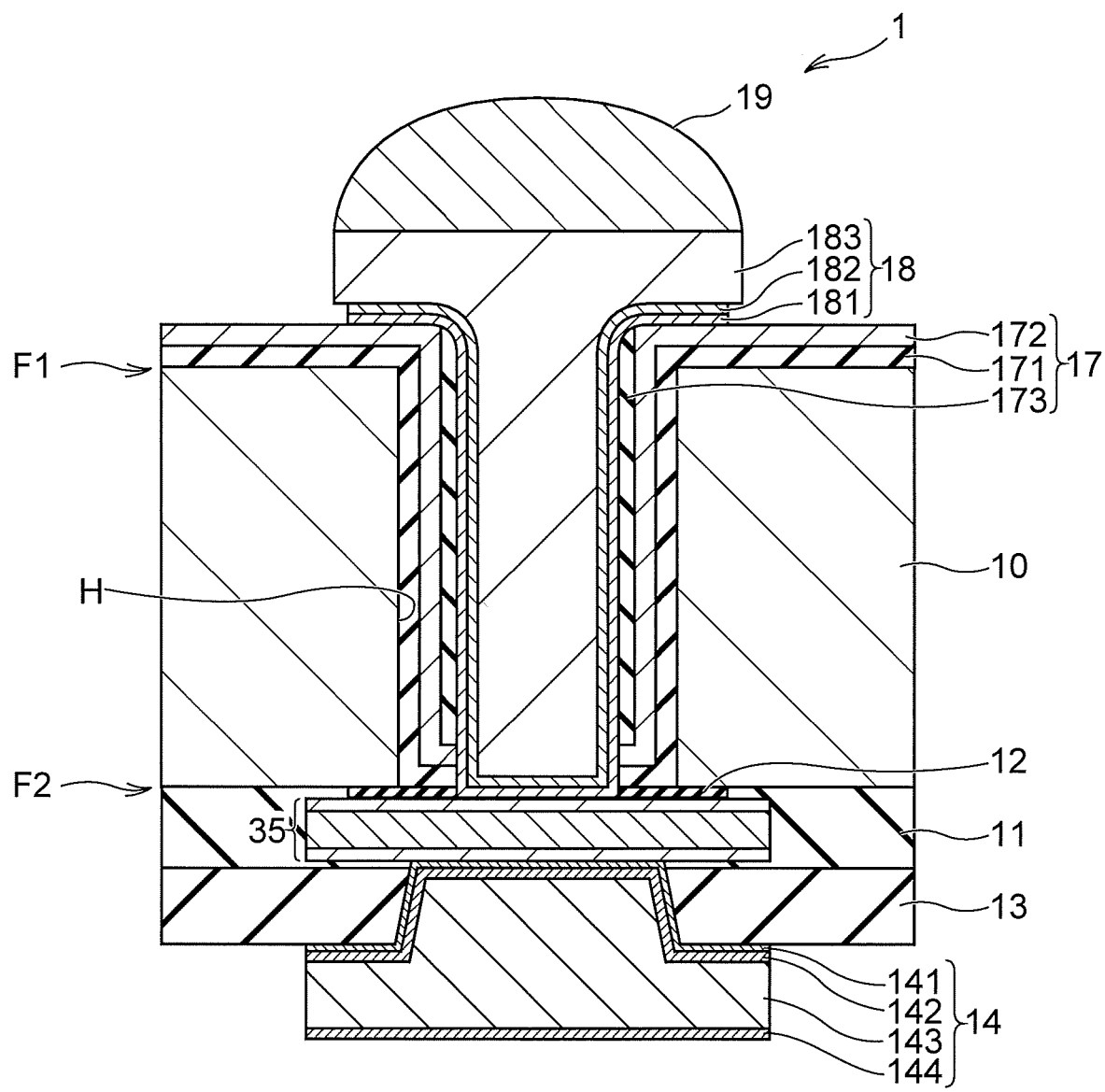
FIG. 1 is a sectional view illustrating a schematic configuration example of a semiconductor device according to the present embodiment.

Embodiments will now be explained with reference to the accompanying drawings. The present invention is not limited to the embodiments. In the embodiments, "an upper direction" or "a lower direction" refers to a relative direction when a direction of a surface perpendicular to a semiconductor substrate on which semiconductor elements or a TSV are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to an embodiment comprises a semiconductor substrate having a through hole from a first face to a second face on an opposite side to the first face. A metal part is provided inside the through hole. A stacked film is provided between the metal part and an inner side surface of the through hole, and comprises a plurality of different material films of two or more types having a relative permittivity equal to or lower than 6.5.

In the following explanations, a face of a semiconductor substrate on which a TSV is formed is assumed as a first face and a face on the opposite side to the first face is assumed as a second face. The second face is a face on which semiconductor elements such as a memory cell array, transistors, resistor elements, capacitor elements, and wires are formed.

FIG. 1 is a sectional view illustrating a schematic configuration example of a semiconductor device according to the present embodiment. As illustrated in FIG. 1, a semiconductor device 1 includes a semiconductor substrate 10, an insulating layer 11, an STI (Shallow Trench Isolation) 12, an insulating layer 13, a first through electrode 14, a second through electrode 18, and a joint material (bump) 19.

The semiconductor substrate 10 is, for example, a silicon substrate. The semiconductor substrate 10 can be thinned to be equal to or smaller than 50 micrometers, for example, about 30±5 micrometers.

The semiconductor substrate 10 has active areas on which semiconductor elements are formed, and the STI 12 that electrically isolates the active areas from each other on a second face F2. Semiconductor elements (not illustrated) such as a memory cell array, transistors, resistor elements, capacitor elements, and wires are formed on the active areas. For example, an insulating film such as a silicon dioxide film is used as the STI 12. The first through electrode 14 that electrically connects the semiconductor elements to the second through electrode 18, and a wiring structure 35 are provided on the second face F2 of the semiconductor substrate 10. The wiring structure 35 is provided on the STI 12 and is electrically connected to the semiconductor elements (transistors, for example) provided on the second face F2 of the semiconductor substrate 10. The semiconductor elements and the wiring structure 35 are coated with the insulating layers 11 and 13. The joint material 19 and the like electrically connected to the second through electrode 18 are provided on a first face F1 of the semiconductor substrate 10.

The insulating layers 11 and 13 coat the wiring structure 35 for the purpose of protecting the wiring structure 35. A passivation layer that covers the semiconductor elements, and an organic layer that coats the passivation layer may be included in the insulating layers 11 and 13. The passivation layer can be a single-layer film of a silicon nitride film (SiN), a silicon dioxide film ($SiO_2$), or a silicon oxynitride film (SiON), or a stacked film including two or more of these films. A resin material such as photosensitive polyimide can be used as the organic layer.

The first through electrode 14 is in contact with the wiring structure 35. The first through electrode 14 can include a barrier metal layer 141 that coats at least a through-hole inner surface, a seed metal layer 142 on the barrier metal layer 141, and a through electrode 143 on the seed metal layer 142. The barrier metal layer 141 may be omitted. A metal film 144 that functions at the time of integration of the semiconductor devices 1 in the vertical direction may be provided on the through electrode 143.

Titanium (Ti), tantalum (Ta), ruthenium (Ru), or the like can be used as the barrier metal layer 141. Copper (Cu), a stacked film (Ni/Cu) including nickel and copper, or the like can be used as the seed metal layer 142. Nickel (Ni) or the like can be used as the through electrode 143. Gold (Au), tin (Sn), copper (Cu), tin-copper (SnCu), tin-gold (SnAu), tin-silver (SnAg), or the like can be used as the metal film 144. However, the layer structure and material of the first through electrode 14 can be appropriately changed depending on intended use. For example, the layer structure and material of the barrier metal layer 141/the seed metal layer 142 or the metal film 144 can be appropriately changed depending on a conductive material used for the through electrode 143 or a formation method thereof.

The second through electrode 18 being a metal part is provided inside a through hole H. The through hole H is provided to extend through the semiconductor substrate 10 from the first face F1 of the semiconductor substrate 10 to the second face F2 thereof. Accordingly, the second through electrode 18 is in contact with the wiring structure 35 and electrically leads the wiring structure 35 onto the first face F1 of the semiconductor substrate 10.

The second through electrode 18 can include a barrier metal layer (a first metal layer) 181 that coats at least a through-hole inner surface, a seed metal layer (a second metal layer) 182 on the barrier metal layer 181, and an electrode body 183 on the seed metal layer 182. Metal materials used therefor can be identical to those of the barrier metal layer 141, the seed metal layer 142, and the through electrode 143 of the first through electrode 14, respectively. A void may be formed in the electrode body 183. The joint material 19 that joins a plurality of the semiconductor devices 1 to each other at the time of integration of the semiconductor devices 1 in the vertical direction (in the thickness direction of the semiconductor substrate 10) can be provided on the electrode body 183. Solder such as tin (Sn), copper (Cu), tin-copper (SnCu), tin-gold (SnAu), or tin-silver (SnAg) can be used as the joint material 19.

A stacked film 17 is provided between the second through electrode 18 and the inner wall surface (the semiconductor substrate 10) of the through hole H. The stacked film 17 is a three-layer film including a first material film 171, a second material film 172, and a third material film 173. The stacked film is provided to electrically separate the second through electrode 18 and the semiconductor substrate 10 from each other. Therefore, the first and third material films 171 and 173 need to be insulating films. Meanwhile, the second material film 172 between the first material film 171 and the third material film 173 does not always need to be an insulating film and can be a conductive material. The stacked film 17 can be a three-layer film including the first to third material films 171 to 173 or may further include other material films.

The first and third material films 171 and 173 are, for example, insulating films such as a silicon dioxide film and are preferably a low-dielectric constant material (a Low-k film) having a relative permittivity equal to or lower than 6.5. The first and third material films 171 and 173 can be same material films or can be material films different from each other. For example, the first and third material films 171 and 173 can both be silicon dioxide films.

For example, a material such as SiOCH or a metallic compound is used as the second material film 172 sandwiched between the first material film 171 and the third material film 173. When SiOCH is used as the second material film 172, it is preferable that the second material film 172 has, for example, a carbon (C) content rate equal to or higher than 50% and be carbon-rich. When a metallic compound is used as the second material film 172, it is preferable that the second material film 172 includes, for example, at least one of a tungsten film (W), a titanium film (Ti), a tantalum film (Ta), an aluminum film (Al), a tungsten oxide film (WO), a titanium oxide film (TiO), a tantalum oxide film (TaO), and an aluminum oxide film (AlO).

Even in a case where the relative permittivity of the second material film 172 is larger than 6.5, it suffices as long as the overall relative permittivity of the stacked film 17 is equal to or lower than 6.5. For example, even when the second material film 172 is a metallic compound, it suffices as long as the overall relative permittivity of the stacked film 17 is equal to or lower than 6.5. Due to setting of the relative permittivity of the stacked film 17 to a low value equal to or lower than 6.5, the parasitic capacitance between the second through electrode 18 and the semiconductor substrate 10 is reduced. This can decrease influences of the voltage of the second through electrode 18 on the semiconductor substrate 10. For example, one of the first and third material films 171 and 173 can be a silicon dioxide film and the other thereof can be a silicon dioxide film, SiN, SiON, SiCN, porous SiOCH, an organic-material insulating film, AlO, TaO, or HfO. As described above, even when a high dielectric material is used in a part, it suffices as long as the overall relative permittivity of the stacked film 17 is equal to or lower than 6.5.

Meanwhile, it is preferable that the processing selectivity between the first and third material films 171 and 173 and the second material film 172 is equal to or higher than 10. Due to setting of the processing selectivity between these films to be equal to or higher than 10, the second material film 172 can be processed using the third material film 173 as a mask and the first material film 171 can be processed using the second material film 172 as a mask. This enables an opening of a relatively-large and stable size to be formed in a self-aligned manner in the STI 12 at the bottom part of the through hole H without using a lithography technique while the entire thickness of the stacked film 17 is relatively thin as will be explained with reference to a manufacturing method described later.

For example, if an opening is to be formed in the STI 12 at the bottom part of the through hole H by means of a single-layer film of a silicon dioxide film (not illustrated) instead of the stacked film 17, the single-layer film of the silicon dioxide film is formed to be thin (with a thickness of about 0.5 micrometers, for example) at the bottom part of the through hole H and thick (with a thickness of about 2.5 micrometers, for example) on the first face F1 outside the through hole H. In this case, the opening can be formed in a self-aligned manner in the STI 12 at the bottom part of the through hole H using a film thickness difference between the single-layer film on the bottom surface in the through hole H and the single-layer film on the first face F1 of the semiconductor substrate 10 outside the through hole H. However, in order to use this single-layer film as a mask, the single-layer film needs to be formed significantly thickly on the first face F1 at the top end of the through hole H. Therefore, a large overhang is produced at the top end part of the through hole H on the side of the first face F1. The overhang is the material of the single-layer film depositing toward the center of the opening at the top end of the through hole H and narrows or closes the opening of the through hole H. Accordingly, the diameter of the opening formed in the STI 12 at the bottom part of the through hole H is decreased due to the overhang of the single-layer film serving as a mask. This leads to a difficulty of the second through electrode 18 in obtaining low and stable contact resistance with the wiring structure 35 and the like, at the bottom part of the through hole H.

In contrast thereto, the semiconductor device 1 according to the present embodiment includes the first and third material films 171 and 173 and the second material film 172 where the processing selectivity therebetween is equal to or higher than 10. For example, when the second material film 172 is SiOCH, one of the first and third material films 171 and 173 can be a silicon dioxide film and the other thereof can be any of a silicon dioxide film, SiN, SiON, SIGN, porous SiOCH, an organic-material insulating film, AlO, TaO, and HfO. Also in this case, the first and third material films 171 and 173 have a processing selectivity equal to or more than ten times with respect to the second material film 172. Furthermore, even when a high dielectric material is used as either the first material film 171 or the third material film 173, the entire stacked film 17 can have a relative permittivity equal to or lower than 6.5. Therefore, even when the film thicknesses of the first to third material films 171 to 173 are relatively small, the second material film 172 can be processed using the third material film 173 as a mask and the first material film 171 can be processed using the second material film 172 as a mask as will be described later. For example, even when the film thicknesses of the first to third material films 171 to 173 provided between the second through electrode 18 and the inner side surface of the through hole H are about 250 nanometers, 250 nanometers, and 500 nanometers, respectively, an opening of a relatively-large and stable size can be formed in the STI 12 at the bottom part of the through hole H in a self-aligned manner without using a lithography technique. Therefore, the second through electrode 18 can be in contact with the wiring structure 35 and the like with low and stable resistance at the bottom part of the through hole H.

A manufacturing method of the semiconductor device according to the present embodiment is explained next.

Figure 2:
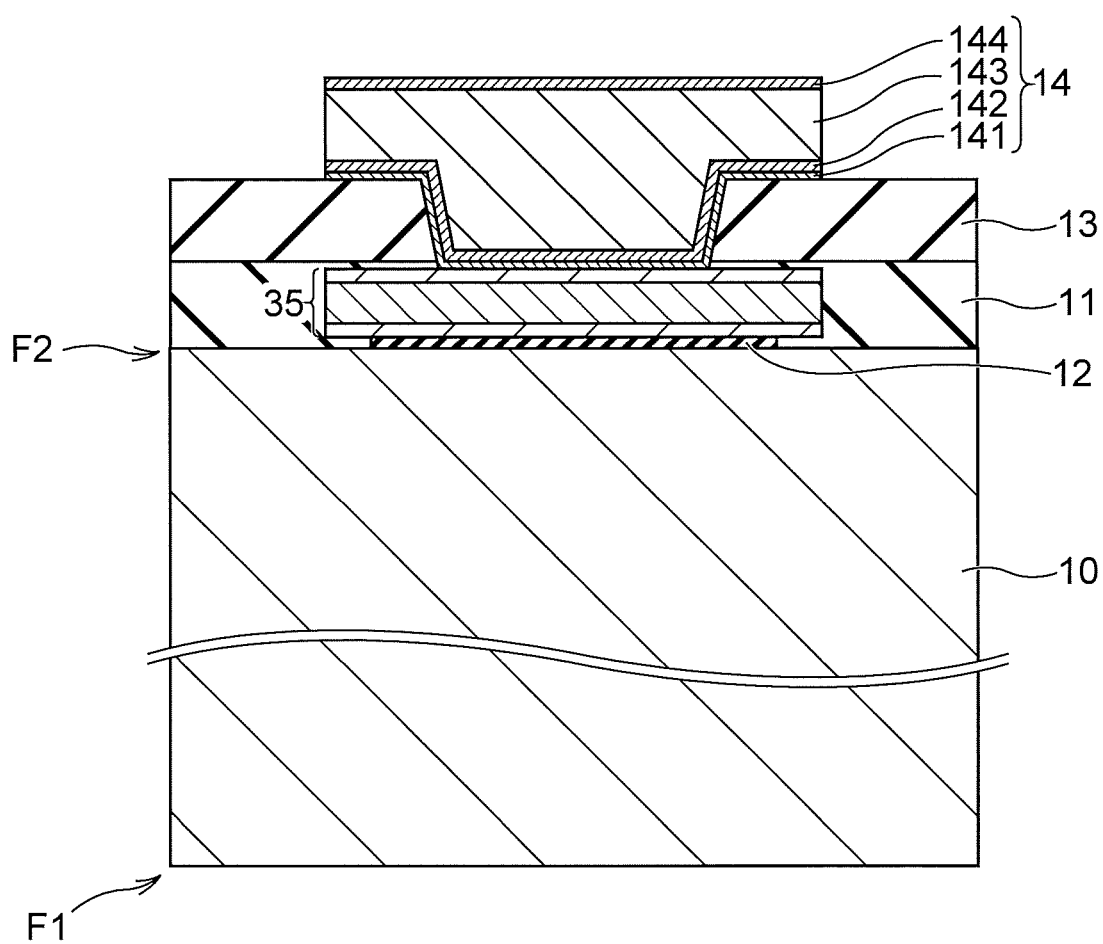
FIGS. 2 to 10 are sectional views illustrating an example of a manufacturing method of the semiconductor device according to the present embodiment.

FIGS. 2 to 10 are sectional views illustrating an example of a manufacturing method of the semiconductor device according to the present embodiment. In FIG. 2, the upper-lower direction of the semiconductor substrate 10 is inverted to those in FIGS. 1 and 3 to 10 for convenience of explanations. In the present embodiment, the semiconductor elements are formed on the second face F2 of the semiconductor substrate 10 and thereafter the second through electrode 18 is formed from the first face F1 of the semiconductor substrate 10. That is, the semiconductor device 1 according to the present embodiment is formed by a so-called via last process. Because the present embodiment adopts the via last process, the semiconductor elements are formed on the second face F2 of the semiconductor substrate 10. Meanwhile, the material films 171 and 172 of the stacked film 17 and metal layers 181A and 182A are provided continuously from the inner side surface of the through hole H to the first face F1 of the semiconductor substrate 10 as illustrated in FIG. 1.

First, the STI 12 is formed on the second face F2 of the semiconductor substrate 10 to define active areas as illustrated in FIG. 2. The semiconductor substrate 10 is, for example, a silicon substrate. The STI 12 is, for example, a silicon dioxide film.

Next, the semiconductor elements (not illustrated) are formed on the active areas. The semiconductor elements can be, for example, a memory cell array, transistors, resistor elements, and capacitor elements. For example, the wiring structure 35 is formed on the STI 12 at the time of forming the semiconductor elements. The semiconductor elements and the wiring structure 35 are coated with the insulating layers 11 and 13. The insulating layer 13 may include a passivation layer that covers the wiring structure 35 and an organic layer that coats the passivation layer. Photosensitive polyimide or the like is used as the organic layer and an opening pattern for forming the first through electrode 14 is transferred onto the organic layer. The opening diameter of the opening pattern can be, for example, about 10 micrometers.

Next, for example, the passivation layer of the insulating layer 13 and the STI 12 are etched using the organic layer as a mask to expose the wiring structure 35. A method such as RIE (Reactive Ion Etching) can be used for etching of the passivation layer and the STI 12. Subsequently, a barrier metal layer using titanium (Ti) and a seed metal layer using copper (Cu) are sequentially stacked entirely on the insulating layer 13 including the inner part of a through hole. A spattering method and a CVD (Chemical Vapor Deposition) method can be used for film formation of the barrier metal layer and the seed metal layer, respectively. The film thickness of the seed metal layer can be, for example, about 500 nanometers.

Next, a mask for forming the through electrode 143 on the seed metal layer is formed using, for example, a PEP (Photo Engraving Process) technique. Subsequently, the through electrode 143 is formed on the seed metal layer exposed from the opening of the mask. A method such as conformal plating can be used for formation of the through electrode 143. For example, nickel (Ni) is used as the through electrode 143.

Next, the mask is removed and thereafter the seed metal layer and the barrier metal layer are removed using the through electrode 143 as a mask. Accordingly, portions of the seed metal layer 142 and the barrier metal layer 141 provided under the through electrode 143 are left behind and other portions of the seed metal layer 142 and the barrier metal layer 141 are removed. Wet etching can be used for patterning of the seed metal layer 142 and the barrier metal layer 141.

Next, the metal film 144 using gold (Au) is formed on the top surface of the through electrode 143. A formation method such as liftoff can be used for formation of the metal film 144. As a result, the first through electrode 14 leading the wiring structure 35 onto the insulating layer 13 is formed on the side of the element formation face (the second face F2) of the semiconductor substrate 10 as illustrated in FIG. 2.

Figure 3:
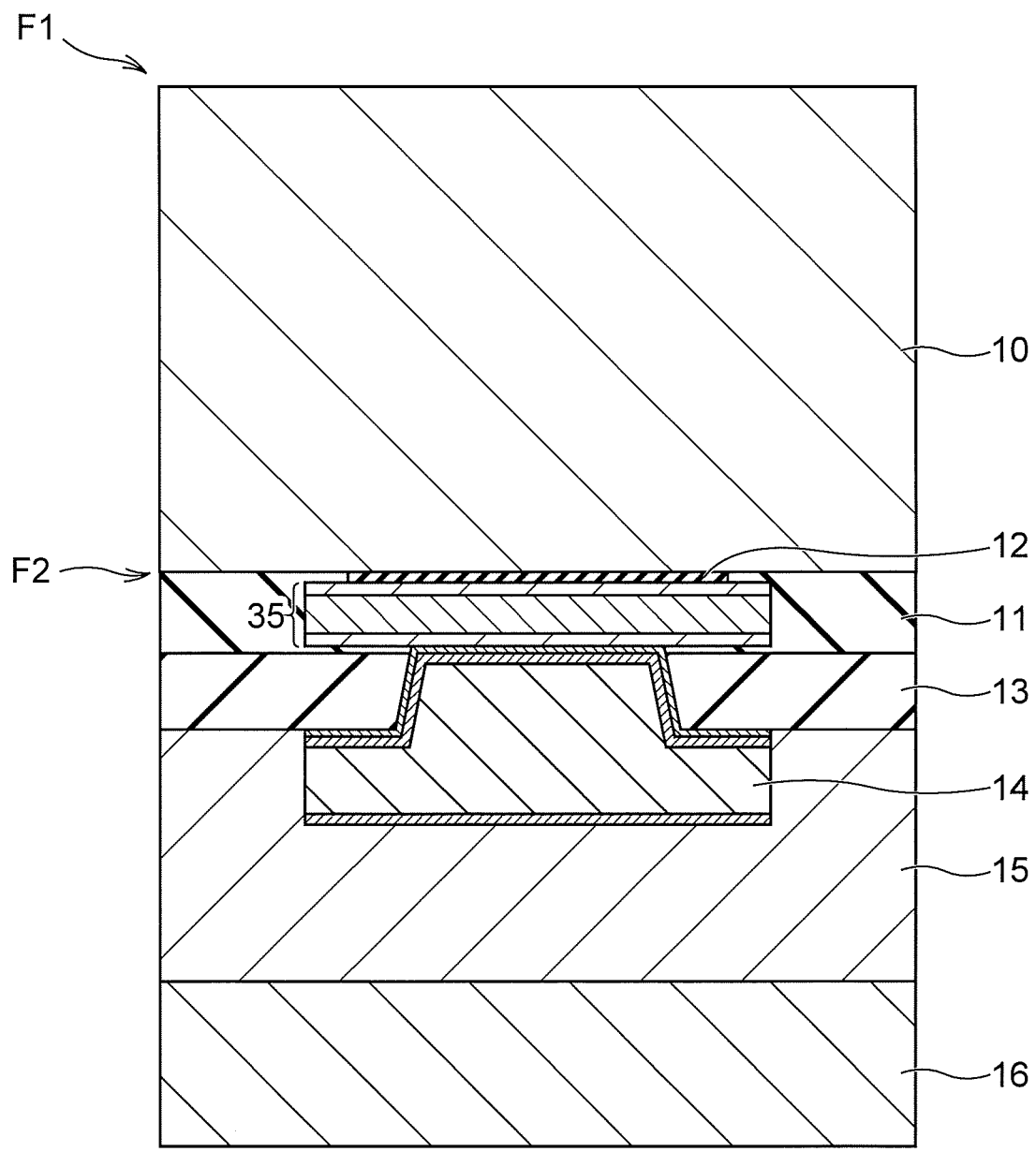

Next, as illustrated in FIG. 3, an adhesive 15 is applied on the insulating layer 13 having the first through electrode 14 formed thereon and a support substrate 16 is attached to the adhesive 15 to cause the support substrate 16 to adhere to the side of the element formation face of the semiconductor device 1 as illustrated in FIG. 3. Subsequently, the semiconductor substrate 10 is ground from the first face F1 on the opposite side to the second face F2 in a state where the support substrate 16 is fixed to a stage, thereby thinning the semiconductor substrate 10 to, for example, about 30±5 micrometers.

Figure 4:
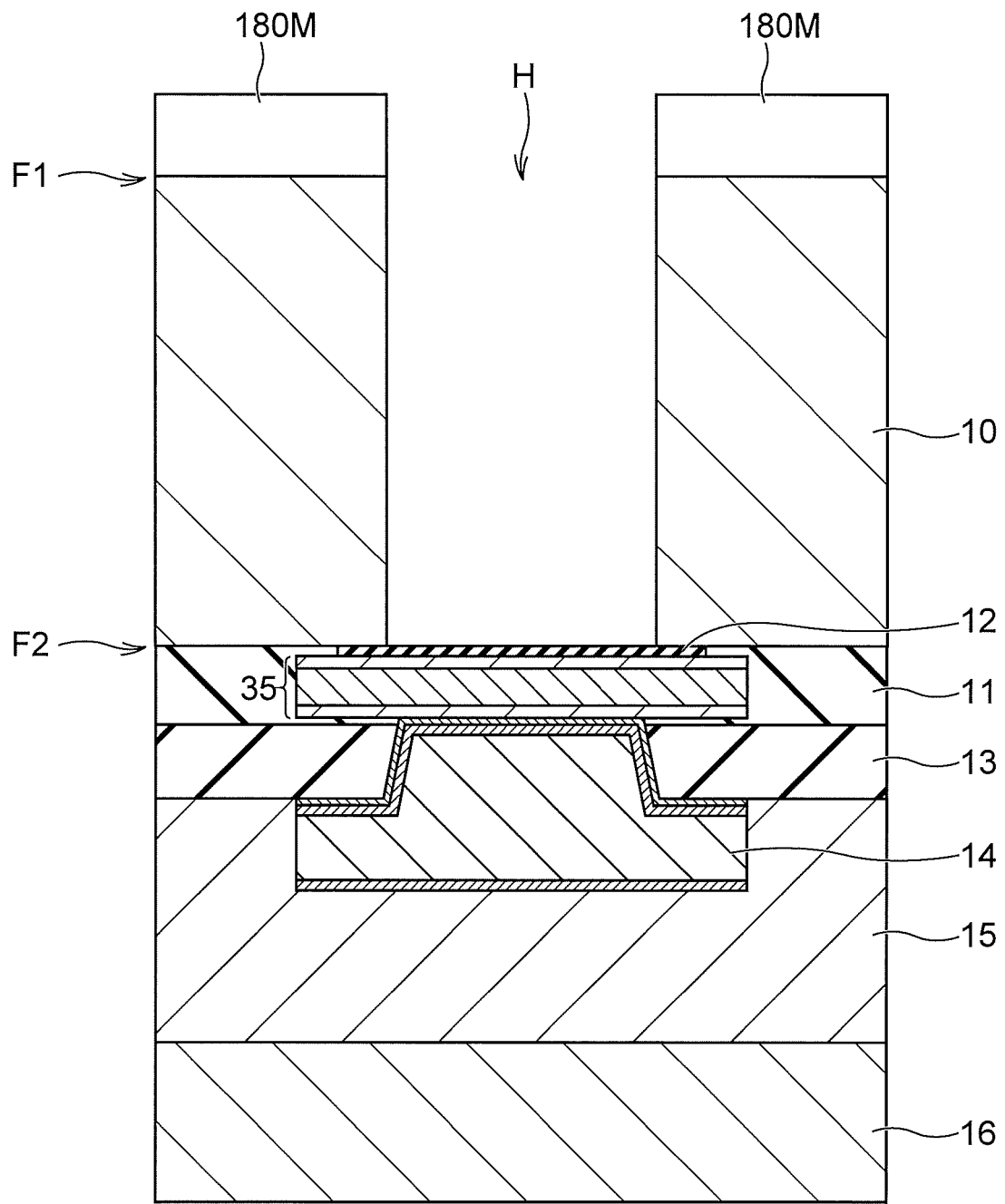

Next, as illustrated in FIG. 4, a photosensitive photoresist 180M is applied on the semiconductor substrate 10 and an opening pattern for forming the second through electrode 18 is formed on the photoresist 180M. The opening diameter of the opening pattern can be, for example, about 10 micrometers. Subsequently, the semiconductor substrate 10 is etched from the first face F1 to the second face F2 using the photoresist 180M as a mask to form the through hole H extending through the semiconductor substrate 10 to reach the STI 12. Anisotropic dry etching (RIE, for example) that provides a high aspect ratio is used for etching of the semiconductor substrate 10.

Figure 5:
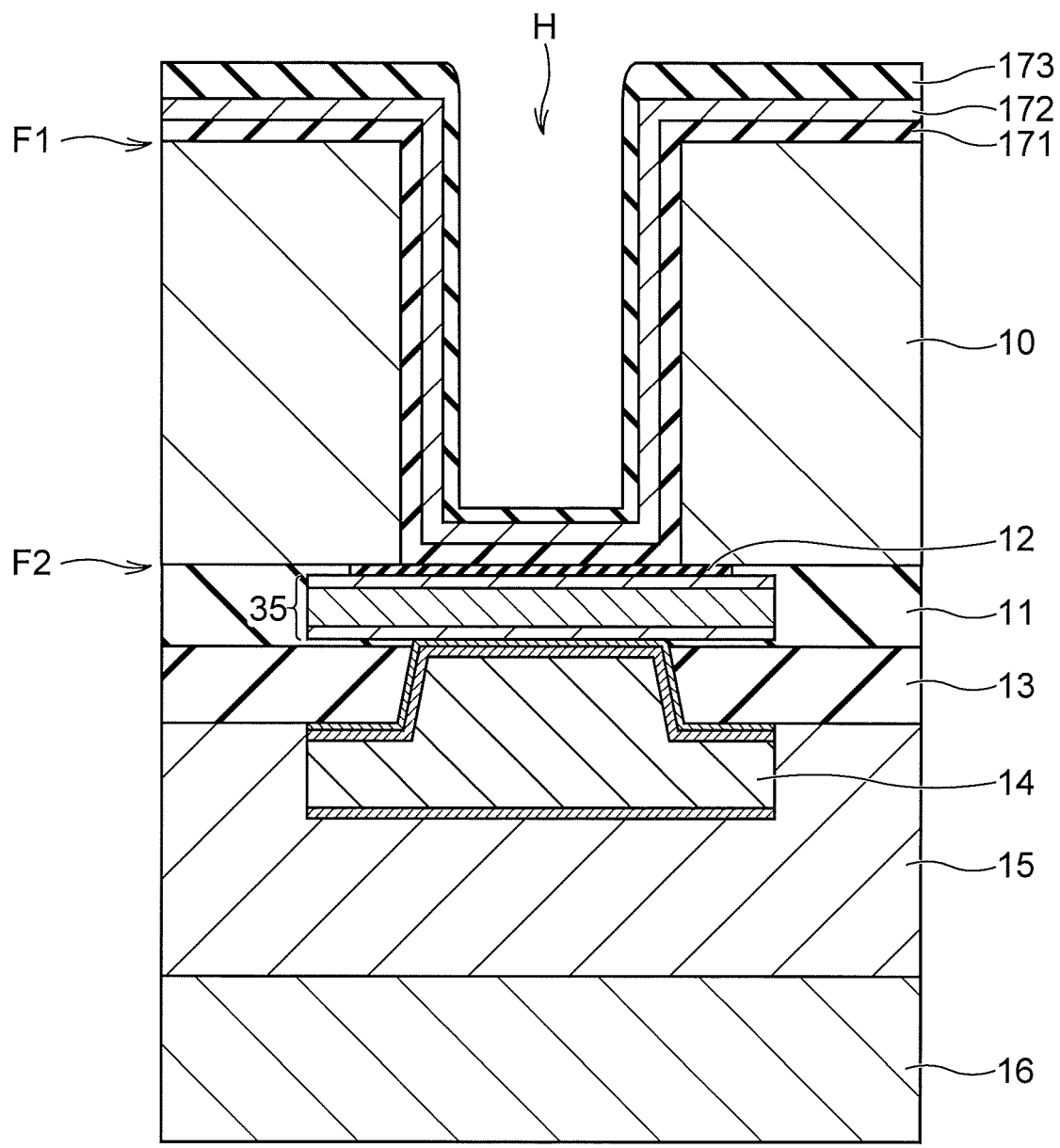

Next, as illustrated in FIG. 5, the first material film 171 is formed entirely on the first face F1 of the semiconductor substrate 10 including the inner wall surface of the through hole H. For example, the CVD method is used for film formation of the first material film 171. The first material film 171 is a material having a relative permittivity equal to or lower than 6.5 and is, for example, a silicon dioxide film (a first silicon dioxide film). The first material film 171 is formed, for example, in a condition equal to or lower than 200° C. If the first material film 171 is formed in a temperature condition higher than 200° C., there is a risk that the support substrate 16 detaches from the first through electrode 14 and the insulating layer 13 due to deterioration of the adhesive 15.

The first material film 171 is formed to have a film thickness substantially uniform on the inner part and the outer part of the through hole H. For example, the film thickness of the first material film 171 is substantially equal on the first face F1 of the semiconductor substrate 10, on the bottom surface of the through hole H, and on the inner wall surface of the through hole H. The film thickness of the first material film 171 is, for example, about 500 nanometers.

Subsequently, the second material film 172 is formed on the first material film 171 in an identical temperature condition using the CVD method, for example. The processing selectivity between the second material film 172 and the first material film 171 is equal to or higher than 10. When the first material film 171 is a silicon dioxide film, the second material film 172 includes, for example, at least one of SiOCH, a tungsten film (W), a titanium film (Ti), a tantalum film (Ta), an aluminum film (Al), a tungsten oxide film (WO), a titanium oxide film (TiO), a tantalum oxide film (TaO), and an aluminum oxide film (AlO). This can set the processing selectivity between the second material film 172 and the first material film 171 to be equal to or higher than 10.

The second material film 172 is also formed to have a film thickness substantially uniform on the inner part and the outer part of the through hole H similarly to the first material film 171. For example, the film thickness of the second material film 172 is substantially equal on the first face F1 of the semiconductor substrate 10, on the bottom surface of the through hole H, and on the inner wall surface of the through hole H. The film thickness of the second material film 172 is, for example, about 250 nanometers.

The third material film 173 is further formed on the second material film 172 in an identical temperature condition using the CVD method, for example. The processing selectivity between the third material film 173 and the second material film 172 is equal to or higher than 10. When the second material film 172 is SiOCH or a metallic compound, the third material film 173 is, for example, a silicon dioxide film (a second silicon dioxide film). This can set the processing selectivity between the third material film 173 and the second material film 172 to be equal to or higher than 10.

The third material film 173 is formed to have a larger film thickness on the outer part of the through hole H than on the inner part thereof. For example, the film thickness of the third material film 173 is about 250 nanometers on the outer part (above the first face F1 of the semiconductor substrate 10) of the through hole H. Meanwhile, the film thickness of the third material film 173 is, for example, about 50 nanometers on the bottom surface of the through hole H and on the inner wall surface of the through hole H. To thus control the film thickness of the third material film 173, it suffices to cause a so-called microloading effect to be prominent by setting the pressure of source gas to a high pressure to change the plasma condition at the CVD step.

Figure 6:
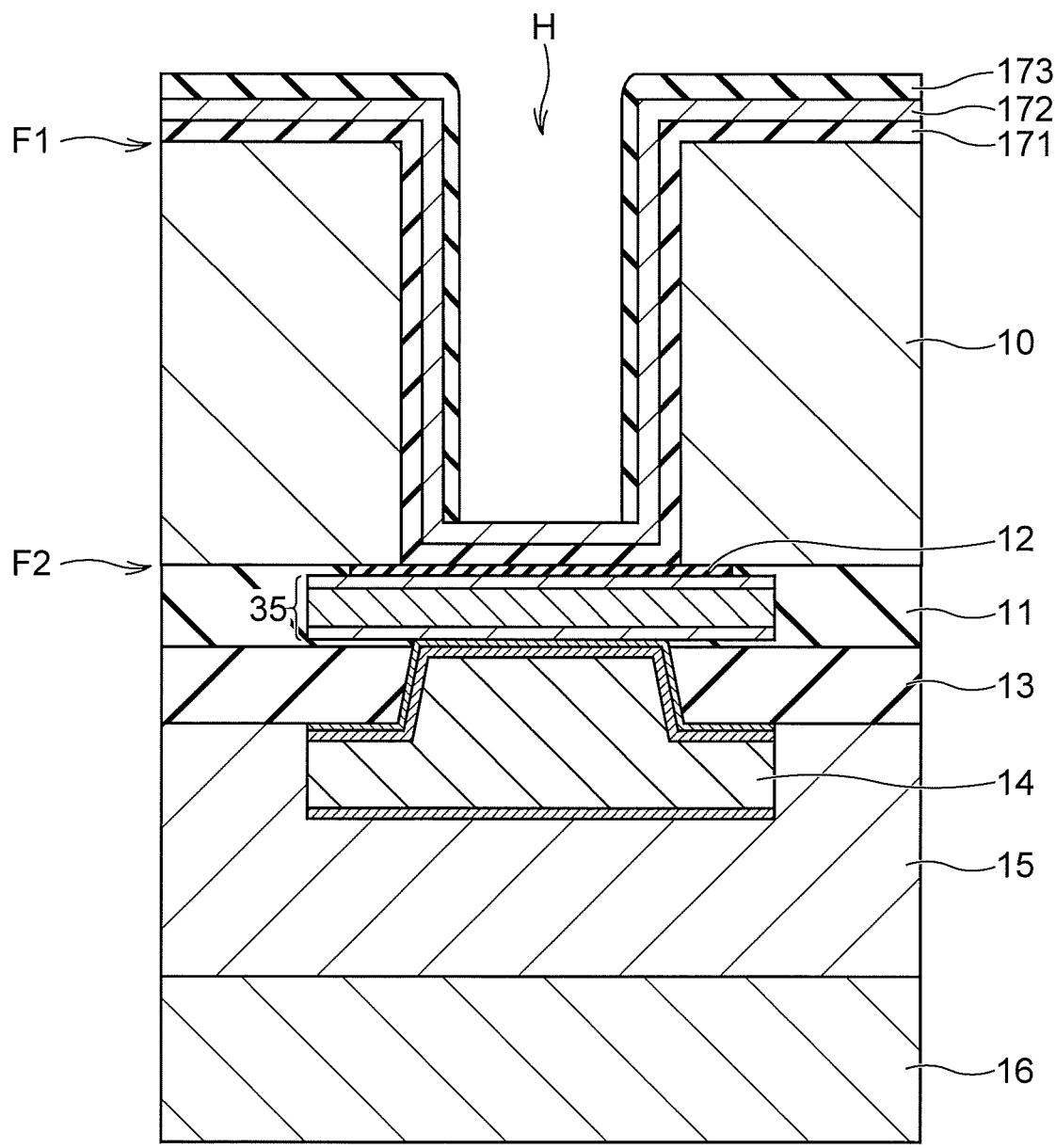

Next, as illustrated in FIG. 6, the third material film 173 is anisotropically etched back using RIE. The film thickness of the third material film 173 is relatively large on the second material film 172 on the outer side of the through hole H and is relatively small at the bottom part of the through hole H. Therefore, due to anisotropic etching of the third material film 173 without using a lithography technique, the third material film 173 is removed at the bottom part of the through hole H while being left behind on the second material film 172 on the outer side and the inner side surface of the through hole H. That is, the third material film 173 at the bottom part of the through hole H can be removed in a self-aligned manner without using a lithography technique through use of the film thickness difference between the inner part and the outer part of the through hole H. When the third material film 173 is, for example, a silicon dioxide film, $CF_4$ gas or the like is used as etching gas. At that time, the third material film 173 has a processing selectivity (an etching selectivity) equal to or more than ten times with respect to the second material film 172 (SiOCH, for example). Therefore, the second material film 172 functions as an etching stopper for the third material film 173 and is exposed at the bottom part of the through hole H.

Figure 7:
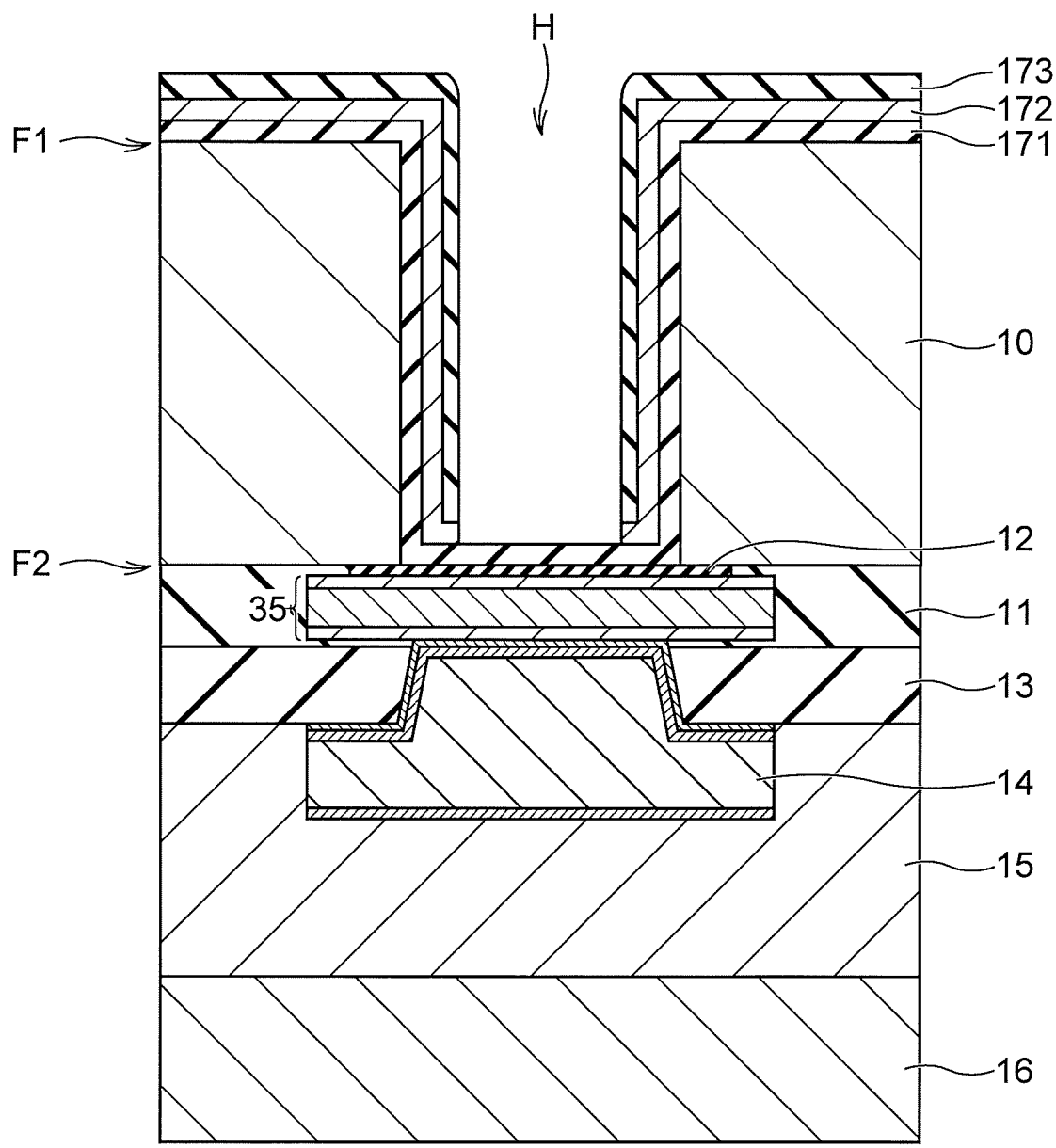

Subsequently, as illustrated in FIG. 7, the second material film 172 is anisotropically etched using RIE. The second material film 172 on the first face F1 of the semiconductor substrate 10 and the inner side surface of the through hole H is coated with the third material film 173 and the second material film 172 is exposed at the bottom part of the through hole H. The second material film 172 has a processing selectivity equal to or more than ten times with respect to the third material film 173. Therefore, while the film thickness of the second material film 172 is substantially equal on the inner part and the outer part of the through hole H, the second material film 172 at the bottom part of the through hole H can be removed using the third material film 173 as a mask. That is, without use of a lithography technique, the second material film 172 at the bottom part of the through hole H can be removed using the third material film 173 as a mask. When the second material film 172 is, for example, SiOCH, $O_2$ gas or the like is used as etching gas. At that time, the first material film 171 (a silicon dioxide film, for example) has a processing selectivity equal to or more than ten times with respect to the second material film 172. Therefore, the first material film 171 functions as an etching stopper for the second material film 172 and is exposed at the bottom part of the through hole H. Either one of the first material film 171 and the third material film 173 can be SiN, SiON, SiCN, porous SiOCH, an organic-material insulating film, AlO, TaO, or HfO instead of the silicon dioxide film. Also in this case, the first and third material films 171 and 173 have a processing selectivity equal to or more than ten times with respect to the second material film 172 (SiOCH, for example). Even when a high dielectric material is used as either the first material film 171 or the third material film 173, the stacked film 17 can have an overall relative permittivity equal to or lower than 6.5.

Figure 8:
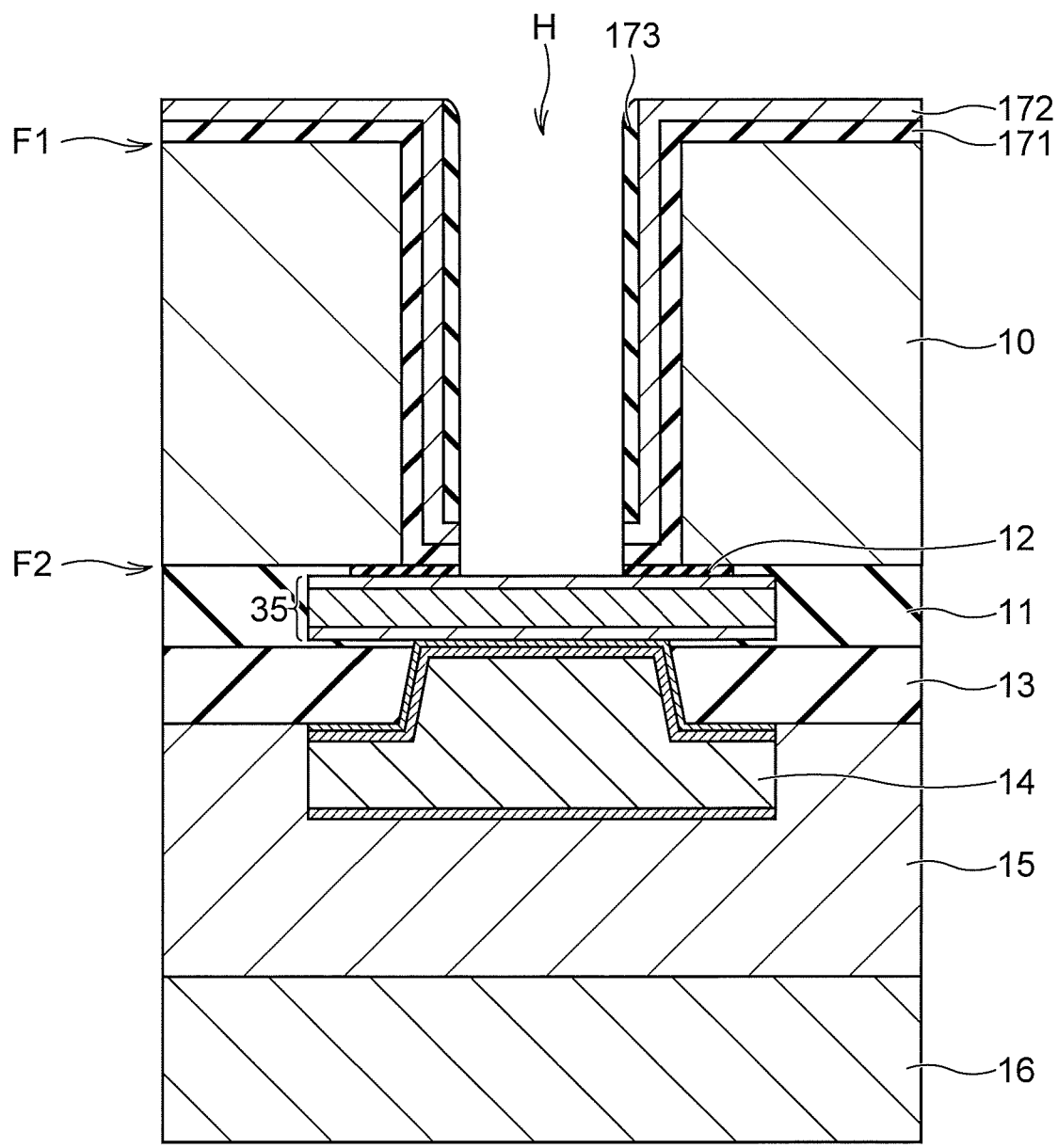

Next, as illustrated in FIG. 8, the first material film 171 is anisotropically etched using RIE. The first material film 171 on the first face F1 of the semiconductor substrate 10 and the inner side surface of the through hole H is coated with the second material film 172 and the first material film 171 is exposed at the bottom part of the through hole H. The first material film 171 has a processing selectivity equal to or more than ten times with respect to the second material film 172. Therefore, while the film thickness of the first material film 171 is substantially equal on the inner part and the outer part of the through hole H, the first material film 171 at the bottom part of the through hole H can be removed using the second material film 172 as a mask. That is, the first material film 171 at the bottom part of the through hole H can be removed using the second material film 172 as a mask without using a lithography technique. The STI 12 is also formed of the same silicon dioxide film as that of the first material film 171. Therefore, the STI 12 can also be removed at the same time as the first material film 171 using the second material film 172 as a mask. Accordingly, the surface of the wiring structure 35 is exposed on the bottom part of the through hole H. The thickness of the STI 12 is, for example, 600 nanometers. The first face F1 of the semiconductor substrate 10 is kept coated with the first and second material films 171 and 172 and the inner side surface of the through hole H is kept coated with the first to third material films 171 to 173.

Figure 9:
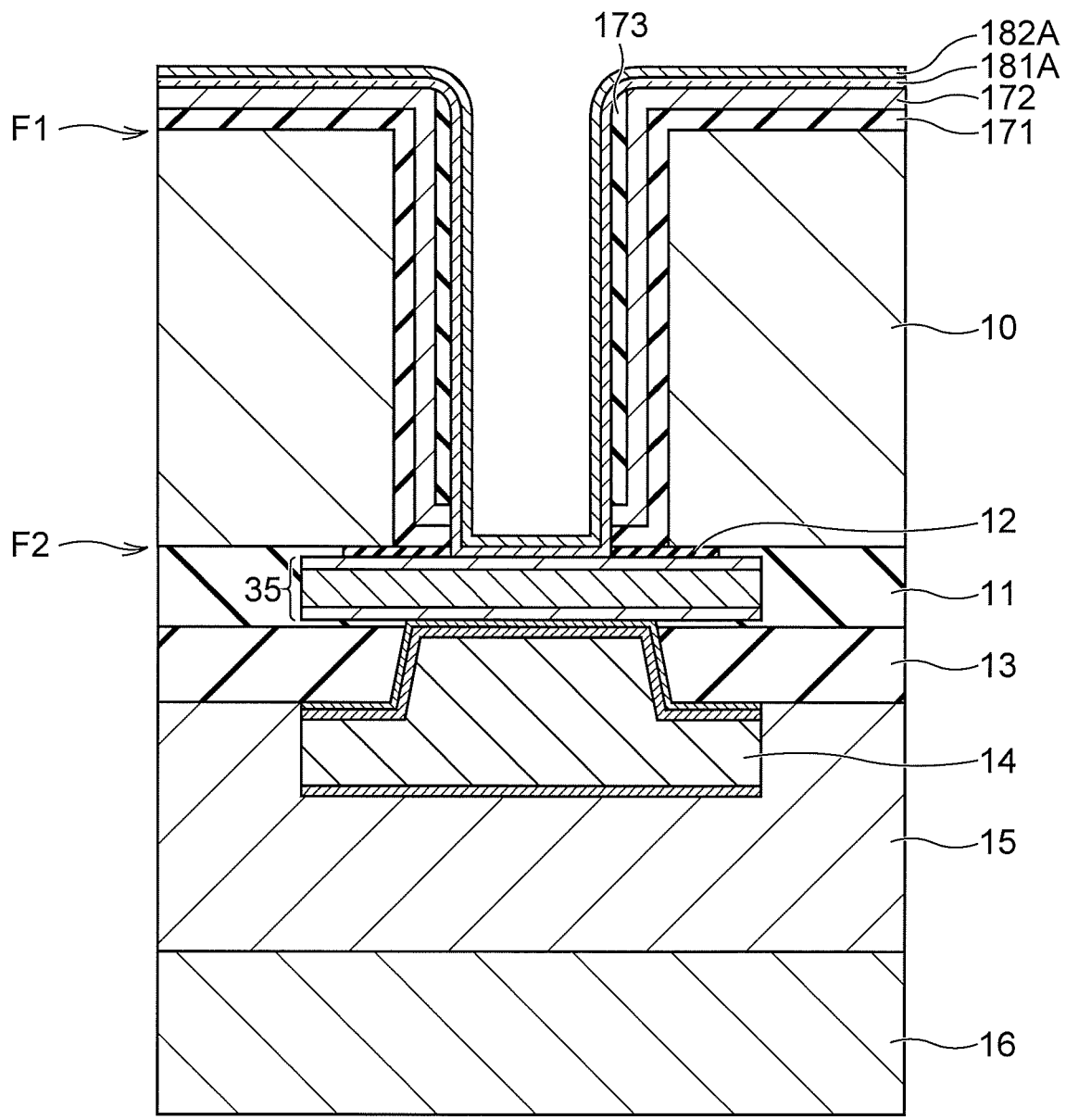

Next, as illustrated in FIG. 9, the barrier metal layer 181A and the seed metal layer 182A are sequentially stacked on the inner part and the outer part of the through hole H. For example, a metal material such as titanium (Ti) is used as the barrier metal layer 181A. For example, a metal material such as copper (Cu) is used as the seed metal layer 182A. The barrier metal layer 181A and the seed metal layer 182A may be referred to simply as "metal layers". While being in contact with the metal layers 181A and 182A, the second material film 172 is electrically separated from the semiconductor substrate 10 by the first material film 171 and therefore may be a metallic compound.

Figure 10:
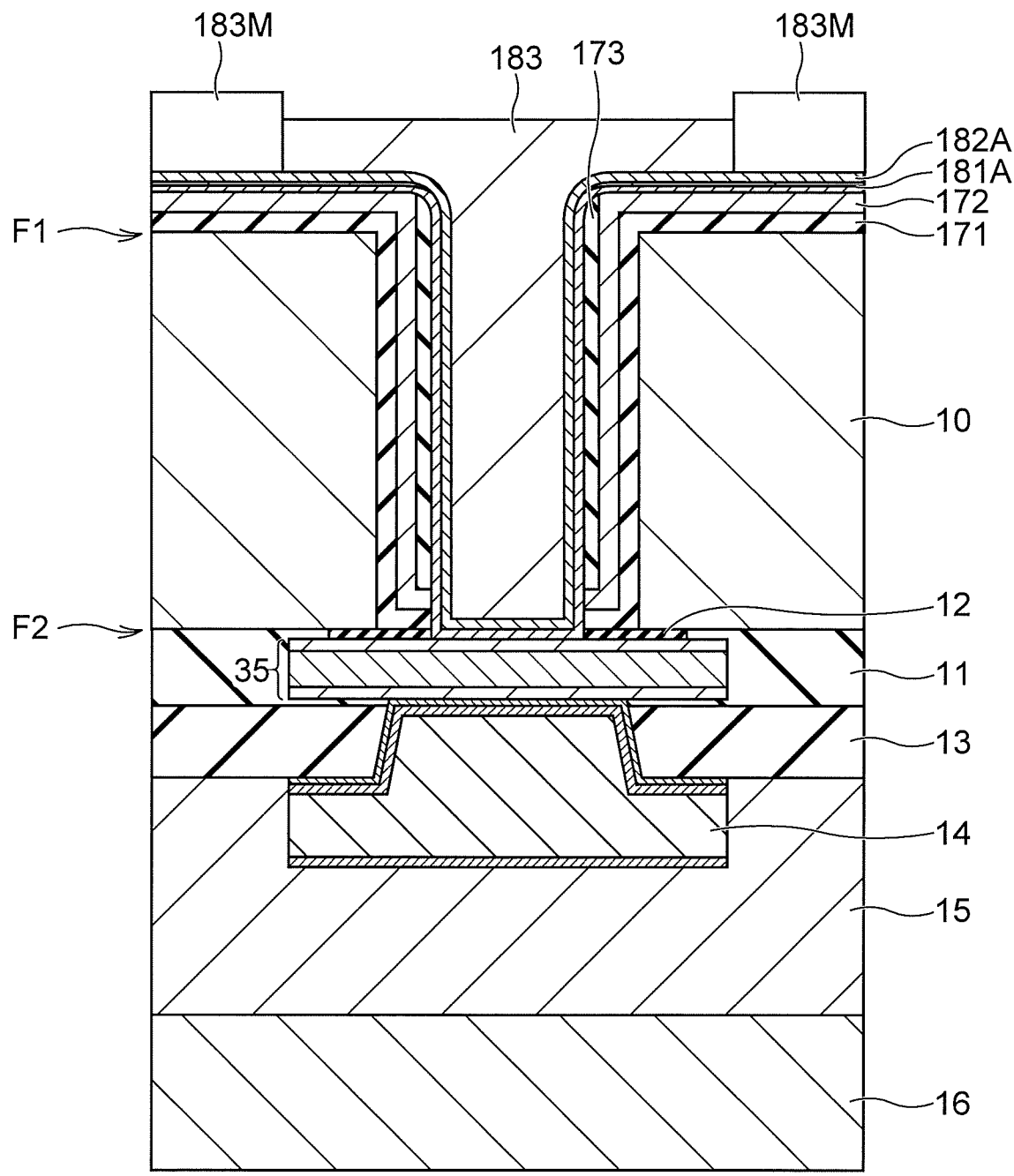

Subsequently, as illustrated in FIG. 10, a mask 183M for forming the electrode body 183 is formed on the seed metal layer 182A, for example, using the PEP technique. Next, the electrode body 183 is formed on the seed metal layer 182A exposed from an opening of the mask 183M. For example, a metal material such as nickel (Ni) is used as the electrode body 183. A method such as conformal plating can be used for formation of the electrode body 183.

Next, the mask 183M is removed and thereafter the seed metal layer 182A and the barrier metal layer 181A are etched using the through electrode 18 as a mask. Wet etching can be used for etching of the seed metal layer 182A and the barrier metal layer 181A.

Subsequently, the joint material 19 is attached onto the top surface of the through electrode 18. For example, a metal material such as gold is used as the joint material 19. A method such as an electrolytic plating method or a non-electrolytic plating method can be used for formation of the joint material 19. Through the steps described above, the second through electrode 18 that electrically leads the wiring structure 35 to the side of the first face F1 of the semiconductor substrate 10 is formed, so that the semiconductor device 1 including the sectional structure illustrated in FIG. 1 is manufactured.

In this way, according to the present embodiment, the STI 12 on the bottom part of the through hole H is removed by means of the stacked film 17 including the first and third material films 171 and 173 and the second material film 172 where the processing selectivity therebetween is equal to or higher than 10. Therefore, even if the film thicknesses of the first and second material films 171 and 172 are substantially uniform and conformal, the STI 12 on the bottom part of the through electrode 18 can be etched and removed sufficiently selectively and in a self-aligned manner when the film thickness of the third material film 173 is different to some extent between the inner part and the outer part of the through hole H.

As described above, if an opening is to be formed in the STI 12 at the bottom part of the through hole H by means of a single-layer film (a silicon dioxide film, for example), the single-layer film of the silicon dioxide film is formed to have a thickness equal to or larger than about 2.5 micrometers on the first face F1 outside the through hole H. Therefore, a large overhang is produced at the top end part of the through hole H on the side of the first face F1. This results in reduction of the opening diameter of the STI 12 on the bottom part of the through hole H. Furthermore, because control of the size of the overhang is difficult, the size of the opening diameter of the STI 12 also becomes unstable.

In contrast thereto, according to the present embodiment, the entire thickness of about 1 micrometer (250 nanometers+250 nanometers+500 nanometers) suffices for the stacked film 17 deposited on the first face F1 outside the through hole H. Therefore, the overhang at the top end part of the through hole H is relatively small. This enables the opening diameter of the STI 12 on the bottom part of the through hole H to be maintained at a relatively large size. Accordingly, the second through electrode 18 can be in contact with the wiring structure 35 at the bottom part of the through hole H with low and stable resistance.

Because the opening diameter of the STI 12 can be increased, coverage of the metal layers 181A and 182A at the bottom part of the through hole H becomes satisfactory.

When the second through electrode 18 has a high aspect ratio, it is relatively easy to form a material film so as to have a large difference in the film thickness between the inner part and the outer part of the through hole H due to a micro-loading effect. On the other hand, if the thickness of the semiconductor substrate 10 is reduced and the aspect ratio of the second through electrode 18 is decreased, the difference in the film thickness of the material film between the inner part and the outer part of the through hole H is unlikely to occur.

In contrast thereto, according to the present embodiment, the processing selectivity between the first and third material films 171 and 173 and the second material film 172 is equal to or higher than 10. Therefore, when the second material film 172 at the bottom part of the through hole H is to be etched, it suffices that the third material film 173 is left behind on the second material film 172 on the outer part of the through hole H, and the film thickness of the third material film 173 may be quite small. Even if the film thickness of the third material film 173 left on the second material film 172 is small, the second material film 172 at the bottom part of the through hole H can be selectively removed using the third material film 173 as a mask because the processing selectivity between the second material film 172 and the third material film 173 is significantly large. That is, even when the aspect ratio of the second through electrode 18 is small and the film thickness difference in the third material film 173 between the inner part and the outer part of the through hole H is small, the second material film 172 at the bottom part of the through hole H can be selectively removed. In this way, according to the present embodiment, the through electrode 18 can be in contact with the wiring structure 35 at the bottom part thereof with low and stable resistance regardless of the magnitude of the aspect ratio of the through hole H.

For example, in the present embodiment, the second through electrode 18 is formed from the first face F1 of the semiconductor substrate 10 after the semiconductor elements are formed on the second face F2 (the via last process). In this case, the second through electrode 18 is formed after the semiconductor substrate 10 is thinned.

Therefore, the aspect ratio of the through hole H may be small. Also in this case, the second through electrode 18 can be in contact with the wiring structure 35 with low and stable resistance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
  a semiconductor substrate having a through hole from a first face to a second face on an opposite side to the first face;
  a metal part provided inside the through hole;
  a stacked film provided between the metal part and an inner side surface of the through hole, comprising a plurality of different material films of two or more types, and having a relative permittivity equal to or lower than 6.5; and
  a semiconductor element provided on the second face of the semiconductor substrate, wherein
  at least a first material film of the stacked film is provided to cover from the inner side surface of the through hole to the first face and continuously cover the first face of the semiconductor substrate,
  when viewed from a direction perpendicular to the first face, a third material film of the stacked film does not cover the first face, and
  a distance along the direction perpendicular to the first face between and end of the third material film on the side of the second face and the first face is shorter than a distance along the direction perpendicular to the first face between the second face adn the first face.

2. The semiconductor device of claim 1, wherein the stacked film comprises a three-layer film of the first material film, a second material film, and the third material film.

3. The semiconductor device of claim 2, wherein the stacked film comprises a SiOCH film or a metallic compound film as the second material film.

4. The semiconductor device of claim 3, wherein the metallic compound film comprises at least one of a tungsten film, a titanium film, a tantalum film, an aluminum film, a tungsten oxide film, a titanium oxide film, a tantalum oxide film, and an aluminum oxide film.

5. The semiconductor device of claim 2, wherein one of the first and third material films is a silicon dioxide film and the other thereof comprises at least one of a silicon dioxide film, SiN, SiON, SiCN, porous SiOCH, an organic-material insulating film, AlO, TaO, and HfO.

6. The semiconductor device of claim 2, wherein
  one of the first and third material films is a silicon dioxide film and the other thereof comprises at least one of a silicon dioxide film, SiN, SiON, SiCN, porous SiOCH, an organic-material insulating film, AlO, TaO, and HfO, and
  the second material film comprises a SiOCH film or a metallic compound film.

7. The semiconductor device of claim 1, wherein
  the stacked film comprises a three-layer film of a first material film, a second material film and the third material film, the first material film being the nearest to the inner side surface among the three stacked films, the second material film being the second nearest to the inner side surface among the three stacked films, the third material film being farther from the inner side surface than the first and second material films, wherein
  the first and second material films are provided on the first face, and
  the third material film is not provided on the first face.

8. The semiconductor device of claim 1, wherein
  the thickness of the stacked film between the metal part and the inner side surface of the through hole is substantially 1 µm.

9. The semiconductor device of claim 1, wherein
  the stacked film includes a second material film between the first material film and the third material film,
  the second material film continuously covers the inner side surface of the through hole to the first face,
  an end of the second material film on the side of the second face is nearer the first face than the second face.

10. A semiconductor device comprising:
  a substrate having a through hole from a first face to a second face on an opposite side to the first face;
  a semiconductor element provided on the second face of the substrate;
  a metal part provided inside the through hole and electrically connected to the semiconductor element; and
  a stacked film provided between the metal part and an inner side surface of the through hole and having a relative permittivity equal to or lower than 6.5, wherein
  the stacked film includes a first material film, a second material film and a third material film stacked in this order from the inner side surface to the metal part,
  the first and second material film are provided on the first face,
  when viewed from a direction perpendicular to the first face, the third material film does not cover the first face, and
  an end of the third material film on the side of the second face is recessed from the second face to the first face.

11. The semiconductor device of claim 10, wherein
one of the first and third material films is a silicon dioxide film and the other thereof comprises at least one of a silicon dioxide film, SiN, SiON, SiCN, porous SiOCH, an organic-material insulating film, AlO, TaO, and HfO.

12. The semiconductor device of claim 10, wherein
the second material film comprises at least one of a tungsten film, a titanium film, a tantalum film, an aluminum film, a tungsten oxide film, a titanium oxide film, a tantalum oxide film, and an aluminum oxide film.

13. The semiconductor device of claim 10, wherein
an end of the second material film on the side of the second face is recessed from the second face to the first face.

14. The semiconductor device of claim 10, wherein
the thickness of the stacked film is substantially 1 µm.

15. The semiconductor device of claim 10, wherein the first and third material films are made by a same material.

* * * * *